United States Patent
Arsovski et al.

(10) Patent No.: US 7,743,270 B2
(45) Date of Patent: Jun. 22, 2010

(54) ASSIGNING CLOCK ARRIVAL TIME FOR NOISE REDUCTION

(75) Inventors: Igor Arsovski, Williston, VT (US); Joseph A. Iadanza, Hinesburg, VT (US); Jason M. Norman, Essex Junction, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 951 days.

(21) Appl. No.: 11/530,544

(22) Filed: Sep. 11, 2006

(65) Prior Publication Data

US 2008/0065923 A1    Mar. 13, 2008

(51) Int. Cl.
*G06F 1/12*     (2006.01)
*G06F 13/42*    (2006.01)
*H04L 5/00*     (2006.01)
*H04L 7/00*     (2006.01)

(52) U.S. Cl. .................................................. 713/400
(58) Field of Classification Search ................ 713/400; 716/1; 326/93; 327/386
See application file for complete search history.

(56) References Cited

U.S. PATENT DOCUMENTS

| | | | |
|---|---|---|---|
| 5,210,700 A | 5/1993 | Tom | |
| 5,355,321 A | 10/1994 | Grodstein et al. | |
| 5,444,407 A | 8/1995 | Ganapathy et al. | |
| 5,657,239 A | 8/1997 | Grodstein et al. | |
| 6,134,670 A | 10/2000 | Mahalingaiah | |
| 6,647,540 B2* | 11/2003 | Lindkvist et al. | 716/10 |
| 6,795,954 B2* | 9/2004 | Andreev et al. | 716/6 |
| 2003/0014724 A1* | 1/2003 | Kojima et al. | 716/10 |
| 2003/0042962 A1 | 3/2003 | Bonaccio et al. | |
| 2003/0066037 A1* | 4/2003 | Patra et al. | 716/2 |

FOREIGN PATENT DOCUMENTS

JP     2000285146 A     10/2000

* cited by examiner

*Primary Examiner*—Thomas Lee
*Assistant Examiner*—Brandon Kinsey
(74) *Attorney, Agent, or Firm*—Michael LeStrange; Hoffman Warnick LLC

(57) ABSTRACT

A method, system and computer program product reducing clock noise generated by clock signals in an integrated circuit (IC) are disclosed. Conventional IC design attempts to ensure coincident clock active edge arrival times for all clocked elements. The coincident active clock edges generate coincident noise currents, which elevates the total noise current. The current invention assigns clock arrival times for clocked elements of an IC based on a desired clock arrival time distribution such that active clock edges are not coincident. As a consequence, the total noise would be spread over a large portion of the clock cycle, thus reducing the noise magnitude substantially.

14 Claims, 4 Drawing Sheets

ASSIGNING CLOCK ARRIVAL TIME FOR NOISE REDUCTION

FIELD OF THE INVENTION

The invention relates generally to an integrated circuit, and more particularly, to a method and system for assigning/re-assigning clock arrival times for clocked elements of the integrated circuit for noise reduction.

BACKGROUND ART

In a typical integrated circuit (IC), clock signals drive large loads, and typically need to have very tight tolerance, which results in large drive strengths of the buffers in, e.g., the clock paths. As application-specific integrated circuit (ASIC) design evolved, IC designers worked to ensure that clock signals for numerous latches of an IC arrive substantially at the same time. In the succeeding generations of ASIC designs, tools to balance clock path delays and circuits such as Clock Generation Phase-Locked-Loops have been developed to ensure high performance logic operation. However, as the number of sequential elements within today's ASICs increases, the instantaneous noise current associated with the simultaneous propagation of clock signals (clocks) through balanced clock trees to thousands of latches has also increased, compromising data integrity and limiting functional performance of ASICs.

Efforts have been made to solve the above noise problem. Recently, Haar et al. (U.S. patent application Ser. No. 10/904,397) provide a method for converting a latch driven by a globally propagated clock to a latch with a phase-shifted, locally-generated clock such that the peak noise event caused by clock propagation may be reduced. However, because Haar et al. operate on an ASIC developed with known placement and timing tools and can only reduce noise at latch points with positive slacks, the amount of noise reduction may be limited.

As such, there is a need in the art to further reduce clock noise within an IC, which is not limited by the timing slacks of clocked elements. The present state of the art technology does not provide a satisfactory solution to this need.

SUMMARY OF THE INVENTION

A method, system and computer program product reducing clock noise generated by clock signals in an integrated circuit (IC) are disclosed. Conventional IC design attempts to ensure coincident clock active edge arrival times for all clocked elements. The coincident active clock edges generate coincident noise currents, which elevates the total noise current. The current invention assigns clock arrival times for clocked elements of an IC based on a desired clock arrival time distribution such that active clock edges are not coincident. As a consequence, the total noise would be spread over a large portion of the clock cycle, thus reducing the noise magnitude substantially.

A first aspect of the invention provides a method of reducing clock noise generated by clock signals in an integrated circuit (IC), the method comprising: determining a desired clock arrival time distribution of clock signals for clocked elements of the IC; and re-assigning clock signal arrival times for the clocked elements based on the desired clock arrival time distribution to reduce clock noise generated by active edges of the clock signals.

A second aspect of the invention provides a system of reducing clock noise generated by clock signals in an integrated circuit (IC), the system comprising: means for determining a desired clock arrival time distribution of clock signals for clocked elements of the IC; and means for re-assigning clock signal arrival times for the clocked elements based on the desired clock arrival time distribution to reduce clock noise generated by active edges of the clock signals.

A third aspect of the invention provides a computer program product for reducing clock noise generated by clock signals in an integrated circuit (IC), the computer program product comprising: computer usable program code, which when executed, enables a computer infrastructure to: determine a desired clock arrival time distribution of clock signals for clocked elements of the IC; and re-assign clock signal arrival times for the clocked elements based on the desired clock arrival time distribution to reduce clock noise generated by active edges of the clock signals.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

1. General Description

Figure 1:
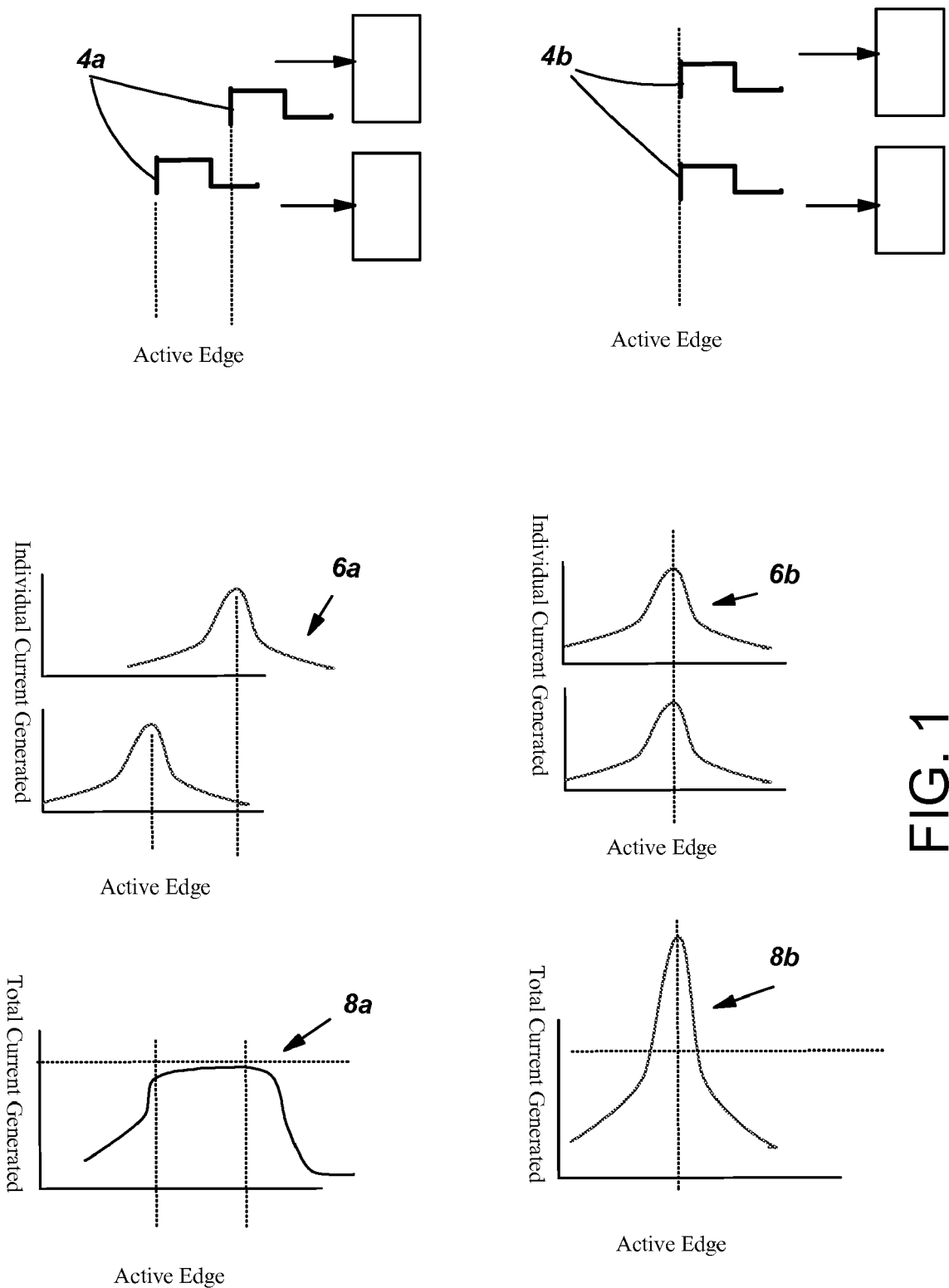
FIG. 1 shows the effect of misaligned active clock edges of clock signals on the peak of current generated by the active clock edges according to one embodiment of the invention.

The current invention is based on an understanding that a power supply current demand focused over a small period of time creates a large power-supply noise. On the other hand, if the same current demand is spread over a larger period of time, the magnitude of the power supply noise is significantly reduced. As such, if the clock signals of two clocked elements, e.g., latches, SRAMs, flipflops, register files, or other data storage elements, have misaligned/non-coincident active edges in time, the current demand is spread over a larger period of time, which reduces the peak noise magnitude. As shown in FIG. 1, clocks 4a with misaligned leading edges generate individual currents 6a with misaligned individual peaks, which results in reduced total peak current 8a, compared with that of total current 8b generated by clocks 4b with aligned leading edges. In FIG. 1 and the following description, the leading edge of a single clock is used as an illustrative example of an active edge, which represents the ordinary clock signal design. In addition, the arrival time of the active clock edge is referred to as clock arrival time. However, using the falling edge as an active edge is also possible and is included in the scope of the current invention.

2. Computer System

Figure 2:
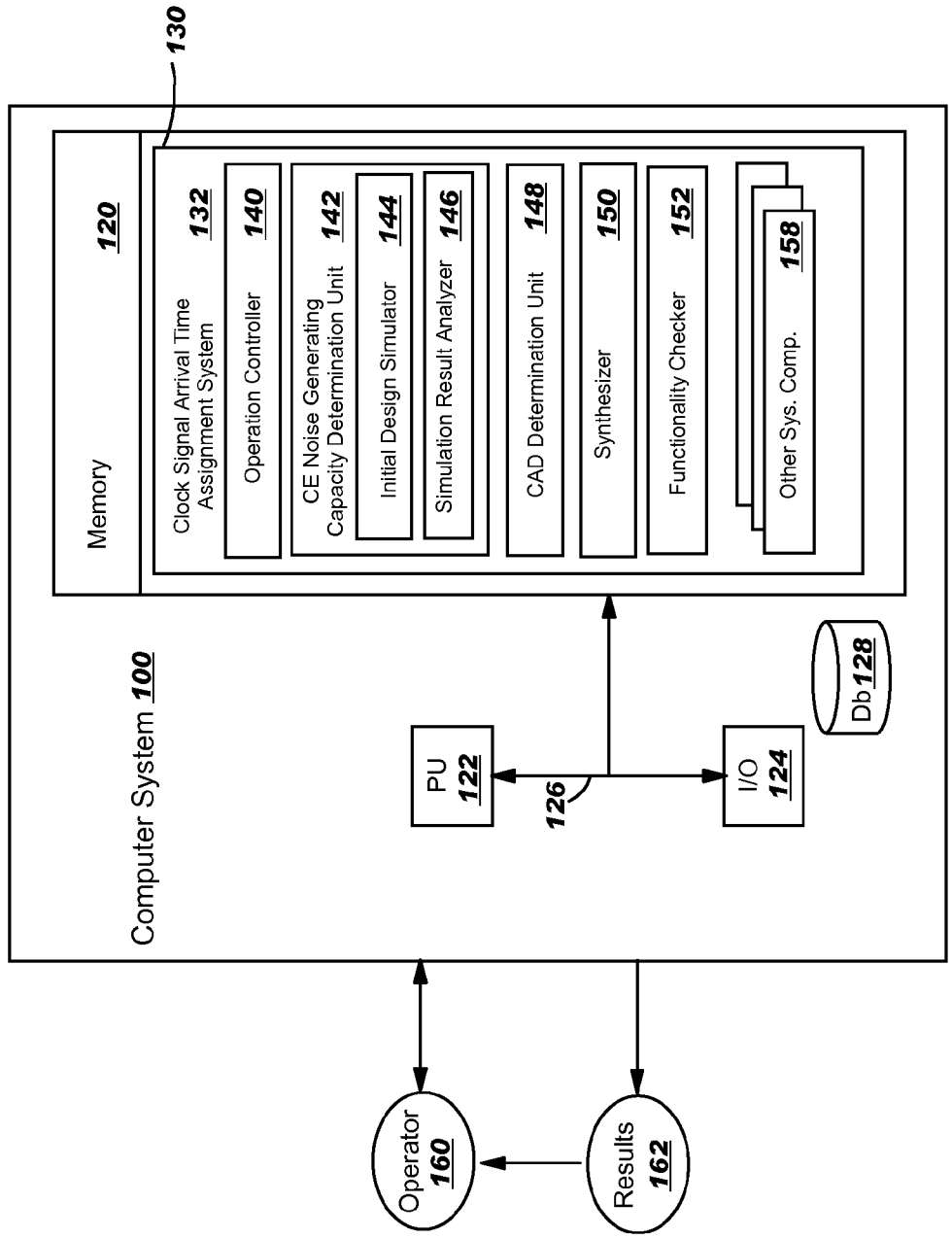
FIG. 2 shows a block diagram of an illustrative computer system according to the present invention according to one embodiment of the invention.

Referring to FIG. 2, a block diagram of an illustrative computer system 100 according to the present invention is shown. In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130 that, when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 2, program product 130 may include a clock signal arrival time assignment system 132 that includes an operation controller 140, a clocked element (CE) noise generating capacity determination unit 142 including an initial design simulator 144 and a simulation result analyzer 146; a clock arrival distribution (CAD) determination unit 148; a synthesizer 150; a functionality checker 152; and other system components 158. Other system components 158 may include any now known or later developed parts of a computer system not individually delineated herein, but understood by those skilled in the art.

Computer system 100 is responsive to an operator 160 during the operation of clock signal arrival time assignment system 132. For example, operator 160 may enter stimulus, e.g., representations of the function contents, function ordering, and/or expected data of a designed integrated circuit (IC), e.g., ASIC. For another example, operator 160 may instruct CAD determination unit 148 in the determination of a desired distribution of clock arrival times for the clocked elements within the designed IC. Results 162 of a clock signal arrival time assignment operation may be communicated to an operators 60 for the operator to design the IC. The operation of clock signal arrival time assignment system 132 will be described in details below.

3. Clock Signal Arrival Time Assignment System

Figure 3:
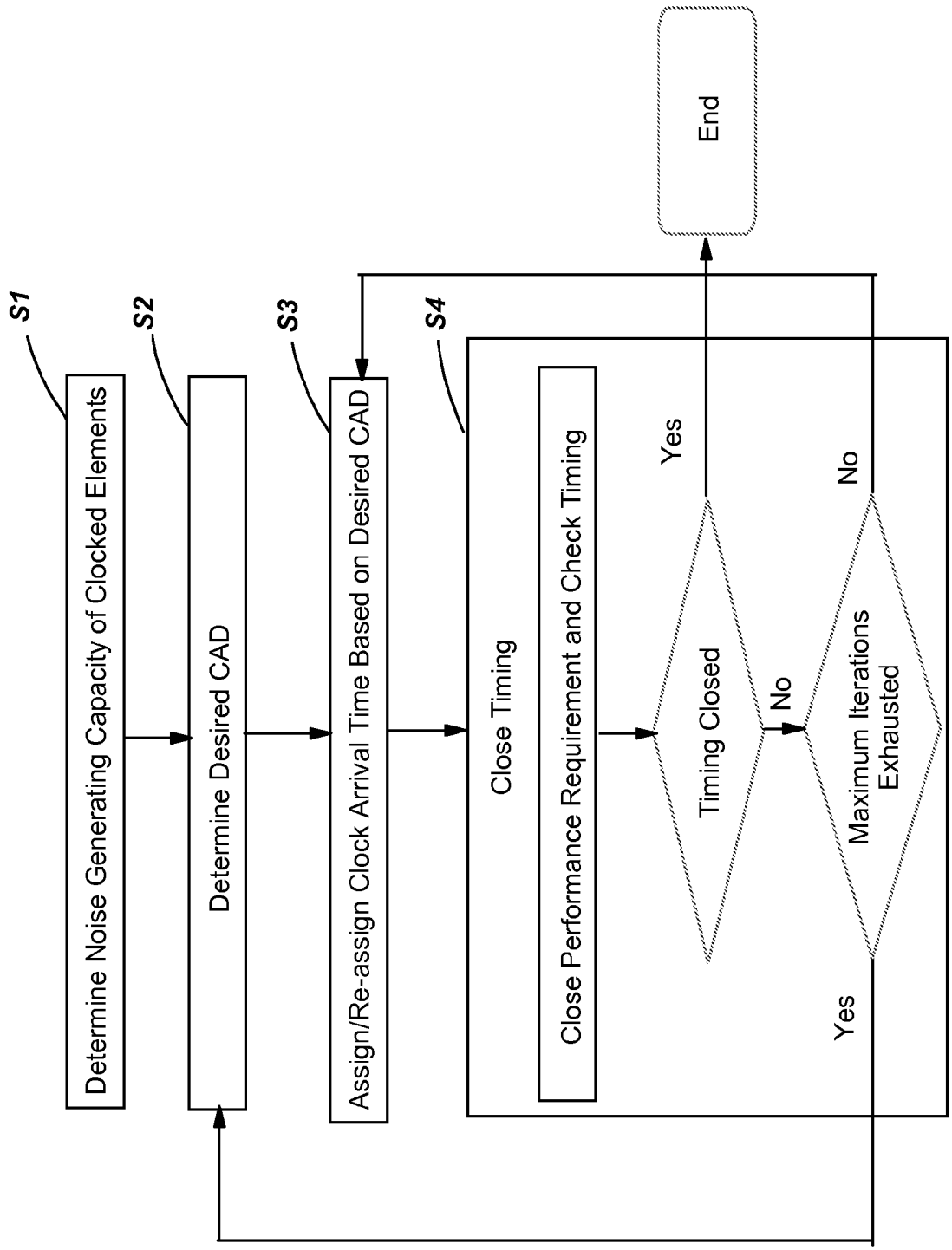
FIG. 3 shows a flow diagram of an operation of a clock signal arrival time assignment system according to one embodiment of the invention.

FIG. 3 shows a flow diagram of an operation of clock signal arrival time assignment system 132 according to one embodiment of the invention. Clock signal arrival time assignment system 132 functions generally to assign clock arrival times at clocked elements of an IC such that the clock arrival times are misaligned to reduce noise currents generated during clock transitions. Clock signal arrival time assignment system 132 may operate on all the clocked elements of a designed IC, i.e., assigning clock arrival times for all clocked elements, or may operate on any portion of all clock elements of the IC. In the following description, assignment of clock arrival times at all clocked elements of an IC is used as an illustrative example with the understanding that the scope of the invention is not limited by this specific example. In addition, clock signal arrival time assignment system 132 may operate to improve an existing IC design where conventional clock generation/distribution techniques are employed. Clock signal arrival time assignment system 132 may also operate on an initially designed IC to help complete the design. In the initially designed IC (or the existing IC design), clock signals arrive at all clocked elements at substantially the same time. In the following description, an initially designed IC will be used to illustrate the operation of clock signal arrival time assignment system 132.

First in S1, clocked element noise generating capacity determination unit 142 determines a noise generating capacity of a clocked element. Specifically, according to one embodiment, initial design simulator 144 first simulates the operation of the initially designed IC to obtain parameters that are related to the noise generating capacities of clocked elements. For example, the pursued parameters may include data switching rate (number of data switching operations within a fixed time period) and loading of a clocked element. According to one embodiment, typical operating conditions of the initially designed IC may be selected to simulate the operation of the IC. In addition, as described above, in the initial design, clock signals arrive at every clocked element at substantially the same time. As is appreciated, any now known or later developed methods may be used in the simulation. For example, the simulation may be performed under register-transfer level (RTL) modeling using VHDL or Verilog languages. For another example, the initial design of the IC may be processed with a first pass of synthesis and the synthesized design may be simulated with a subset of regression tests.

Next, simulation result analyzer 146 analyzes the obtained noise generation related operation parameters to determine a noise generating capacity of a clocked element. Further, simulation result analyzer 146 may assign a priority to a clocked element in the assignment of clock arrival time based on the noise generating capacity of the clocked element. For example, simulation result analyzer 146 may compare the obtained noise generation related parameter (parameters) with a preset threshold. If the parameters of a clocked element meet the threshold, the clocked element will be assigned a priority, i.e., a priority clock element. On the other hand, if the parameters of a clocked element do not meet the threshold, the clocked element will not be assigned priority. It should be appreciated that any method may be used in the comparison, and all are included in the invention. For example, each single parameter may be compared to the respective threshold. For another example, the obtained parameters may be normalized, weighted and combined to obtain a combined score to be compared with a threshold.

In addition, in S1, initial design simulator 144 may also obtain other operation parameters of clock elements that are related to the assignment of clock arrival time, e.g., timing characteristics of a clocked element. For example, initial design simulator 144 may obtain timing slacks of all the clocked elements. Various types of timing slacks may be determined, including but not limited to: setup slacks, hold slacks, clock gating slacks, pulse width slacks, and pulse separation slacks. In this description, a setup timing slack of a timing path leading to a clocked element may be used as an illustrative example to describe the operation of clock signal arrival time assignment system 132. A setup timing slack may be determined by the following equation:

$$\text{Setup timing slack} = \text{clock arrival time} + \text{clock cycle adjust} - \text{timing path signal arrival time} - \text{guard time} \quad (1)$$

However, it should be appreciated that uses of other modes of arrival times for analyses and other formulae for timing slack are also included in the current invention. According to formula (1), a later clock arrival time contributes to a more positive timing slack.

Next in S2, clock arrival distribution (CAD) determination unit 148 determines a desired distribution of clock arrival times at all clocked elements. Any method/standard/test may be used in the determination of the desired clock arrival distribution. As in the simulation operation of S1, the CAD determination may be performed on the initially designed IC where clock signals for all clocked elements arrive at substantially the same time (nearly identical arrival time). The nearly identical clock arrival time of the initially designed IC model will be referred to as an "index arrival time". As will be described later, assignment of clock arrival times will be effected by shifting the index arrival time for each clocked elements.

Figure 4:
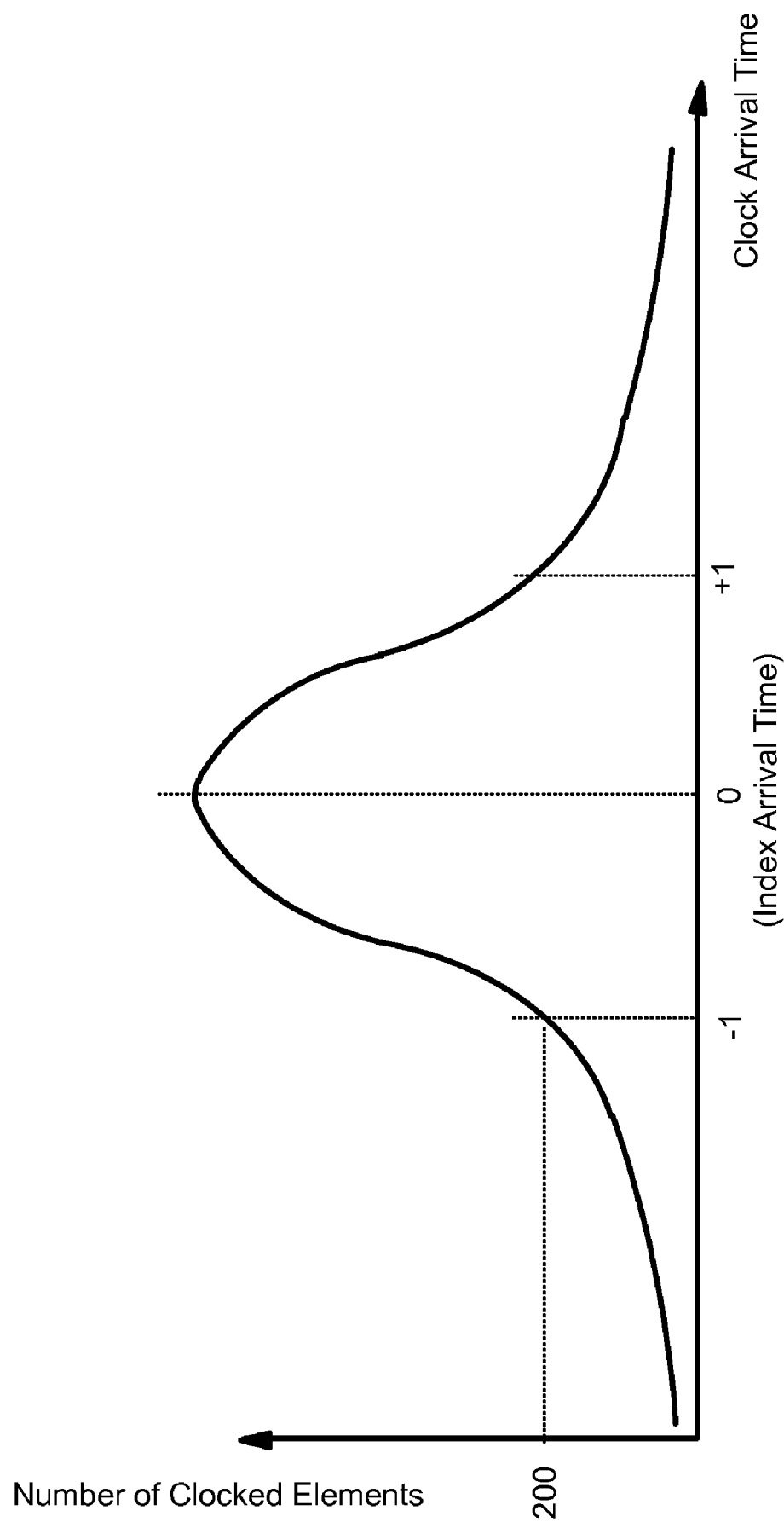
FIG. 4 shows an exemplary clock arrival distribution according to one embodiment of the invention.

As is appreciated, any clock arrival distribution may be determined/selected to fit the designed IC, and all are included in the scope of the invention. For example, the desired clock arrival distribution may be a Gaussian distribution as shown in FIG. 4. The Gaussian curve is centered at the index arrival time. That is, it is desired that clocks for more clocked elements arrive at the index arrival time than at other times shifted from the index arrival time. As such, the index arrival time is indicated as "0" in FIG. 4, and other clock arrival times are indicated by the degree of shifting from the index arrival time. As is appreciated, other factors being stable, the wider the CAD curve, the less noise current generated by the active clock edges as the active edges (i.e., the arrival times) are more separated.

Next in S3, synthesizer 150 assigns/re-assigns clock arrival times to every clocked element based on the obtained noise generating capacity and the desired clock arrival distribution. As is appreciated, an initially designed IC has already assigned a clock arrival time for a clocked element, e.g., nearly identical clock arrival time for all clocked elements. As such, the assignment of clock arrival time in S3 is technically always a re-assignment. Moreover, in the operation of clock signal arrival time assignment system 132, the clock arrival times for clocked elements may be re-assigned/adjusted as will be described later. As such, in this description, "assign" and "re-assign" may be used interchangeably, which does not affect the scope of the invention. Specifically, according to one embodiment, synthesizer 150 fits clock arrival times of all the clocked elements onto the desired CAD. For example, if the CAD of FIG. 4 stipulates that two hundred clocked elements have clock arrival time of −1 (i.e., 1 time point earlier than the index arrival time "0"), synthesizer 150 will assign arrival time −1 to two hundred clocked elements. One question is how to select clocked elements to fit the specific positions in the desired CAD, e.g., arrival time −1.

One basic principle for the clock arrival time assignments is to reduce the noise generated by the active edges of clocks. As such, according to one embodiment, synthesizer 150 assigns clock arrival times to the priority clocked elements (i.e., those that tend to generate more noise) before assigning clock arrival times to other clocked elements. According to one embodiment, there are two principles in assigning clock arrival times to the priority clocked elements: (1) priority clocked elements need to have clock arrival times separated from that of other clocked elements as far as possible; and (2) priority clocked elements need to have clock arrival times separated from one another as far as possible. Applying the two principles, the priority clocked element is assigned a clock arrival time that is substantially coincident to fewer other clock arrival times than a clock arrival time assigned to a clocked element without priority. Practically, priority clocked elements may be assigned clock arrival times in the left tail and the right tail of the CAD curve of FIG. 4.

In addition, for both priority clocked elements and other clocked elements, the assignments of clock arrival time may be also based on the timing characteristics of the clocked elements obtained from the initial design simulation. For example, if a clocked element has a positive timing slack (e.g., based on formula (1)), this clocked element may be assigned an arrival time shifted to the right (i.e., delayed arrival time) or to the left (i.e., earlier arrival time) of the index arrival time, although shifting to the left may be limited by the actual value of the positive slack. On the other hand, if a clocked element has a negative timing slack in the initial simulation, functionality of the IC may require assigning a clock arrival time that is shifted to the right (later) from the index arrival time to make the timing slack for this clocked element more positive.

Next, after the clock arrival times for the priority clocked elements have been assigned, synthesizer 150 assigns clock arrival times for other clocked elements. According to one embodiment, the clock arrival times for the other clocked elements may be assigned randomly to fit the openings in the CAD, with consideration of their timing slacks in the initial design simulation as described above.

Next in S4, functionality checker 152 and operation controller 140 work together to close the timing of the IC. Specifically, functionality checker 152 first closes the performance requirements of the IC with the assigned clock arrival times for the clocked elements, and checks the timing of the clocked elements. Any now known or later developed methods may be used to close the performance requirements of the designed IC, and all are included in the current invention. For example, deep/wide synthesis and/or circuit re-powering may be used in the performance closure. As is appreciated, even if the assignments of arrival times are based on the timing characteristics of the clocked elements in the initial design simulation, the timing of the IC after the clock arrival time assignments may not be closed. As such, functionality checker 152 may check the timing of the IC using any methods, e.g., a simulation. If timing of the IC is closed, the operation of clock signal arrival time assignment system 132 ends. If timing of the IC is not closed, operation controller 140 checks whether a pre-set maximum iteration for adjusting clock arrival time assignments has been exhausted. If the maximum iteration has not been exhausted, operation controller 140 controls the operation of clock signal arrival time assignment system 132 to go back to S3 to adjust clock arrival time assignments to close the timing of the IC including the clocked elements with timing failures. Specifically, synthesizer 150 first re-assigns clock arrival times for the clocked elements with a timing failure. For example, if a clocked element has a negative timing slack, synthesizer 150 may re-assign a clock arrival time by shifting the previously assigned clock arrival time to the right (i.e., delayed clock arrival time) to resolve the problem. After re-assigning clock arrival times for the clocked elements with timing failures, synthesizer 150 re-adjusts the arrival times for the rest clocked elements, if necessary, to re-fit the desired CAD. In the re-fitting, synthesizer 150 will only adjust the clock arrival times for the clocked elements with a higher margin of positive timing slack, but not the clocked elements with a lower margin of positive timing slacks. After re-assigning and re-fitting clock arrival times, S4 will be performed again. As such, S3 and S4 will be reiterated until timing of the IC is closed or the maximum iterations have been exhausted.

If the maximum iteration of adjusting clock arrival time and closing timing have been exhausted and the timing of the IC still is not closed, operation controller 140 will control the operation to go back to S2 to re-determine the desired CAD, e.g., a narrowed Gaussian curve, and reiterate the steps that follow until timing of the IC is closed. Alternatively, functionality checker 152 may correct timing failures (without consideration of matching the CAD), while preserving the remainder of the assignments.

4. Conclusion

While shown and described herein as a method and system for reducing clock noise generated by clock signals in an integrated circuit, it is understood that the invention further provides various alternative embodiments. For example, in one embodiment, the invention provides a program product stored on a computer-readable medium, which when executed, enables a computer infrastructure to reduce clock noise generated by clock signals in an integrated circuit. To this extent, the computer-readable medium includes program code, such as clock signal arrival time assignment system 132 (FIG. 2), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 2) and/or database 128 (FIG. 2), and/or as a data signal traveling over a network (e.g., during a wired/wireless electronic distribution of the program product).

In another embodiment, the invention provides a method of generating a system for reducing clock noise generated by clock signals in an integrated circuit. In this case, a computer infrastructure, such as computer system 100 (FIG. 2), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 1), from a computer-readable medium; (2) adding one or more computing devices to the computer infrastructure; and (3) incorporating and/or modifying one or more existing systems of the computer infrastructure, to enable the computer infrastructure to perform the process steps of the invention.

In still another embodiment, the invention provides a business method that performs the process described herein on a subscription, advertising supported, and/or fee basis. That is, a service provider could offer to reduce clock noise generated by clock signals in an integrated circuit. In this case, the service provider can manage (e.g., create, maintain, support, etc.) a computer infrastructure, such as computer system 100 (FIG. 2), that performs the process described herein for one or more customers and communicates the results of clock arrival timing assignments to one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method of reducing clock noise generated by clock signals in an integrated circuit (IC), the method comprising:

determining a desired clock arrival time distribution of clock signals for clocked elements of the IC;

determining a noise generating capacity of a clocked element; and re-assigning clock signal arrival times for the clocked elements based on the desired clock arrival time distribution to reduce clock noise generated by active edges of the clock signals, wherein the re-assigning is performed on a priority clocked element before a clocked element without priority, the priority clocked element having a noise generating capacity that meets a pre-set threshold.

2. The method of claim 1, wherein the priority clocked element is assigned a clock arrival time that is substantially coincident to fewer other clock arrival times than a clock arrival time assigned to a clocked element without priority.

3. The method of claim 1, wherein the re-assigning fits clock arrival times of the clocked elements to the determined clock arrival time distribution.

4. The method of claim 1, wherein the re-assigning is based on determined timing characteristics of the clocked elements.

5. The method of claim 1, further comprising closing timing of the IC with re-assigned clock arrival times for the clocked elements.

6. The method of claim 5, further comprising one of adjusting the re-assignment of clock arrival times for the clocked elements and re-determining a desired clock arrival time distribution, in the case that the timing of the IC fails to be closed.

7. A system of reducing clock noise generated by clock signals in an integrated circuit (IC), the system comprising:
  means for determining a desired clock arrival time distribution of clock signals for clocked elements of the IC;
  means for determining a noise generating capacity of a clocked element; and
  means for re-assigning clock signal arrival times for the clocked elements based on the desired clock arrival time distribution to reduce clock noise generated by active edges of the clock signals, wherein the re-assigning means re-assigns a clock arrival time for a priority clocked element before re-assigning a clock arrival time for a clocked element without priority, the priority clocked element having a noise generating capacity that meets a pre-set threshold.

8. The system of claim 7, wherein the priority clocked element is assigned a clock arrival time that is substantially coincident to fewer other clock arrival times than a clock arrival time assigned to a clocked element without priority.

9. The system of claim 7, wherein the re-assigning means fits clock arrival times of the clocked elements to the determined clock arrival time distribution.

10. The system of claim 7, wherein the re-assigning means re-assigns clock arrival times based on determined timing characteristics of the clocked elements.

11. The system of claim 7, further comprising means for closing timing of the IC with re-assigned clock arrival times for the clocked elements.

12. A computer program product stored in a computer-readable medium for reducing clock noise generated by clock signals in an integrated circuit (IC), the computer program product comprising: computer usable program code, which when executed, enables a computer infrastructure to:
  determine a desired clock arrival time distribution of clock signals for clocked elements of the IC;
  enable a computer infrastructure to determine a noise generating capacity of a clocked element;
  re-assign clock signal arrival times for the clocked elements based on the desired clock arrival time distribution to reduce clock noise generated by active edges of the clock signals:
  and
  enable a computer infrastructure to re-assign a clock arrival time for a priority clocked element before re-assigning a clock arrival time for a clocked element without priority, the priority clocked element having a noise generating capacity that meets a pre-set threshold.

13. The program product of claim 12, wherein the program code is further configured to enable a computer infrastructure to re-assign clock arrival times by fitting clock arrival times of the clocked elements to the determined clock arrival time distribution.

14. The program product of claim 12, wherein the program code is further configured to enable a computer infrastructure to close timing of the IC with re-assigned clock arrival times for the clocked elements, and in the case that the timing of the IC fails to be closed, configured to one of adjust the re-assignment of clock arrival times for the clocked elements and re-determine a desired clock arrival time distribution.

* * * * *